(12) United States Patent
Zametzky (10) Patent No.: US 8,269,557 B2
(45) Date of Patent: Sep. 18, 2012

(54) ELECTRONIC AMPLIFIER

(76) Inventor: Klaus Zametzky, Schwabach (DE)

( * ) Notice: Subject to any disclaimer, the term of this patent is extended or adjusted under 35 U.S.C. 154(b) by 85 days.

(21) Appl. No.: 12/809,721

(22) PCT Filed: Nov. 26, 2008

(86) PCT No.: PCT/DE2008/001995
§ 371 (c)(1),
(2), (4) Date: Jun. 21, 2010

(87) PCT Pub. No.: WO2009/086798
PCT Pub. Date: Jul. 16, 2009

(65) Prior Publication Data
US 2010/0271127 A1      Oct. 28, 2010

(30) Foreign Application Priority Data
Dec. 22, 2007   (DE) .......................... 10 2007 063 117

(51) Int. Cl.
*H03F 3/45* (2006.01)
(52) U.S. Cl. ...................................... 330/252
(58) Field of Classification Search .............. 330/69, 330/252, 297
See application file for complete search history.

(56) References Cited

U.S. PATENT DOCUMENTS

| 4,217,556 A | 8/1980 | Ito et al. |
| 4,337,441 A * | 6/1982 | Kellogg ........................ 330/261 |
| 7,193,459 B1 * | 3/2007 | Epperson et al. ............. 330/130 |

FOREIGN PATENT DOCUMENTS

| EP | 0 443 507 A | 8/1991 |
| JP | 55 005534 A | 1/1980 |

OTHER PUBLICATIONS

Su W J et al.: "New Architecture High Performance Voltage Follower" Electronics Letters, IEE Stevenage, GB, vol. 30, No. 22, Oct. 27, 1994, pp. 1826-1827 ISSN: 0013-5194.
Lidgey FJ et al.: "High Accuracy, High Speed Voltage-Follower"Circuits and System, 1998. ISCAS '98. Proceedings of the 1998 IEEE International Symposium on Monterey, CA, USA, May 31-Jun. 3, 1998, New York, NY, USA IEEE, US, vol. 1, May 31, 1998, pp. 460-463, XP010289592, ISBN: 978-0-7803-4455-6.

* cited by examiner

*Primary Examiner* — Steven J Mottola
(74) *Attorney, Agent, or Firm* — Lucas & Mercanti, LLP (57) ABSTRACT

An electronic amplifier is characterized by a first stage (1) controlled by an input voltage UE, the operating voltage of said stage being on positive and/or negative potentials (V1+/V1A-), which are always constant with respect to the input voltage (UE), and further by a second impedance-converting stage (2), which is controlled by a voltage supplied by the first stage (1) and the operating voltage of which is on positive and/or negative potentials (V5+/V5A-), which are always constant with respect to the voltage supplied by the first stage (1).

12 Claims, 10 Drawing Sheets

FIG. 1

PRIOR ART

ELECTRONIC AMPLIFIER

This application is a 371 of PCTDE2008/001995 filed Nov. 26, 2008, which in turn claims the priority of DE 10 2007 063 117.2 filed Dec. 22, 2007, the priority of both applications is hereby claimed and both applications are incorporated by reference herein.

The invention relates to an electronic, in particular linear, amplifier.

Figure 1:
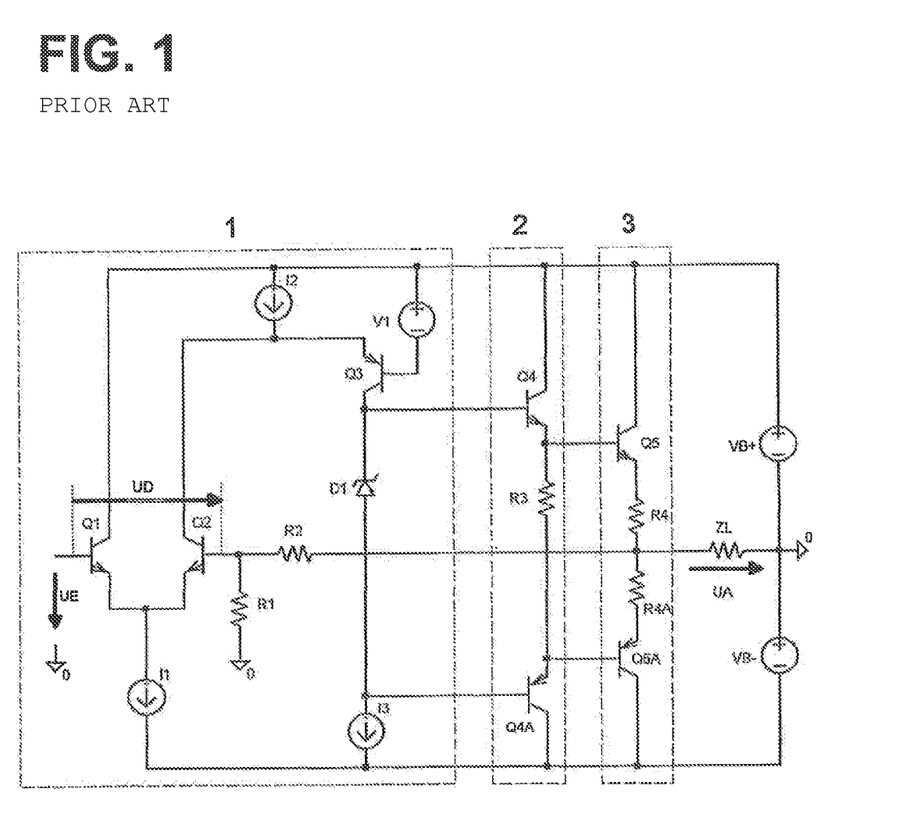
FIG. 1 shows the circuit arrangement of a known amplifier with a voltage-amplifying stage, a driver stage and an output stage.

An amplifier of this type is known, as shown in FIG. 1, for example. There it consists of a stage 1 having three transistors Q1, Q2, Q3, which amplifies an input voltage UE, a driver stage 2 having two transistors Q4 and Q4A, and also an output stage 3 having two transistors Q5 and Q5A, which drives a load impedance ZL.

In the amplifier stage 1, two transistors Q1 and Q2 form a differential amplifier, the quiescent current of which is determined by a constant-current source I1. In this case, I1 is a current source bearing the name I1 which carries a constant current having the intensity I1. (This nomenclature shall hereinafter be correspondingly applicable to all other sources as well.)

A transistor Q3 operating with common-base connection and a constant-current source I2 extend the amplifier stage 1 having the transistor Q2 to form an inverting cascode circuit. A constant-current source I3 serves as collector impedance or operating impedance for the inverting cascode circuit. A voltage source V1 and the voltage drop across a zener diode D1 serve for setting operating points or quiescent currents of the transistors Q4 and Q4A of the driver stage 2 and also of the transistors Q5 and Q5A of the output stage 3.

The driver stage 2 contains two transistors Q4 and Q4A, which operate as an emitter follower and serve as a driver for the control inputs of the output stage 3. The output stage 3 is formed from two transistors Q5 and Q5A, which likewise operate as an emitter follower, serve for impedance conversion and drive the load impedance ZL, across which the output voltage UA is dropped.

All three stages of the amplifier are fed from two voltage sources VB+ and VB−, which are referred to a quiescent ground potential 0, that is to say that they are directly connected to said quiescent ground potential 0.

This known amplifier according to FIG. 1 operates as follows:

As the input voltage UE rises at the base of the transistor Q1, the collector current thereof also rises such that, in a manner constrained by the constant-current source I1, the collector current of the transistor Q2 falls to approximately the same extent. As a result, in a manner constrained by the constant-current source I2, the emitter current of the transistor Q3 rises by an approximately identical magnitude. As a consequence thereof, the voltages at the bases of the transistors Q4 and Q4A of the driver stage 2 and at the bases of the transistors Q5 and Q5A of the output stage 3 also rise and, consequently, the output voltage UA dropped across the load impedance ZL also rises.

This known amplifier according to FIG. 1 contains only one voltage-amplifying inverting cascode circuit and operates in a stable and broadband manner since comparatively few phase-rotating low-pass filters act in series in the control circuit. The differential gain AD=UA/UD that can be obtained with this amplifier is limited, however, and the non-linearities of the transistors Q5 and Q5A of the output stage 3 are corrected only incompletely. The circuit will therefore produce non-negligible distortions, primarily when the load impedance ZL to be driven is of low impedance.

The differential gain that can be obtained in the amplifier according to FIG. 1 is limited specifically by the following mechanisms:

1. as the input voltage UE rises at the base of the transistor Q1, the voltage drop across the constant-current source I1 rises and therefore so does the current I1 of said constant-current source, because the latter has a finite internal resistance in the real circuit. However, this current rise counteracts a decrease in the collector current of the transistor Q2 and hence a high differential gain;

2. as the output voltage UA rises, the magnitudes of the collector-emitter-voltages of the transistors Q3 and Q4 fall and therefore, owing to the Early effect, so does the current gain of said transistors, such that the base currents thereof rise, this current rise also counteracting a high differential gain;

3. as the output voltage UA rises, the voltage drop across the constant-current source I3 also rises and therefore so does the current I3 of said constant-current source, because the latter has a finite internal resistance in the real circuit. This current rise also counteracts a high differential gain;

4. if the power loss and the input capacitance of the differential amplifier Q1/Q2 are intended to be kept within favorable limits, then the collector currents of the transistors Q1 and Q2 and hence the transconductance of the differential amplifier Q1/Q2 are limited, which likewise counteracts a high differential gain.

In order to avoid the disadvantages enumerated above, the amplifier according to FIG. 1 could be supplemented by further voltage-amplifying stages and the negative feedback loop could be embodied across a plurality of stages in order to increase the differential gain. However, a negative feedback across a plurality of stages would be associated with considerable stability problems owing to the increasing phase rotations in the control loop, which problems could in turn be avoided by the insertion of a dominant low-pass filter having a low cut-off frequency, but this would lead to a smaller bandwidth of the amplifier.

An additional factor is that a good efficiency is generally required in the case of a power amplifier. The transistors Q5 and Q5A of the output stage 3 would therefore have to operate in class AB mode and hence in a characteristic curve range which would result in great nonlinearities.

The invention is based on the first object of significantly increasing the linearity and the lack of distortion of an amplifier of the type described in the introduction, without increasing the number of amplifier stages within a control loop.

This object is achieved by virtue of the fact that, the electronic amplifier comprises a first stage which is controlled by an input voltage UE and the operating voltage of which is at positive and/or negative potentials (V1+/V1A−) which are always constant with respect to the input voltage (UE); a second, impedance-converting stage, which is controlled by a voltage supplied by the first stage and the operating voltage of which is at positive and/or negative potentials (V5+/V5A−) which are always constant with respect to the voltage supplied by the first stage. The operating voltages of virtually all the amplifier stages lying in the signal path are at positive and/or negative potentials which are always constant with respect to the input signal (designated by the inventor as "floating sources" since they float at the input voltage and do not change relative thereto, even if potentials within the circuit shift in the course of signal modulation).

Said first object is furthermore achieved by means of: the electronic amplifier, wherein the amplifier is controlled by an input voltage (UE), and a first amplifier (OP1) and a second amplifier (OP2), which supplies an output signal (UA), said amplifiers cooperating as a noninverting compound amplifier, the operating voltage of the first amplifier (OP1) being at positive and/or negative potentials (V3+,V4−) which are always constant with respect to the input voltage (UE); the electronic amplifier comprises a linear analog driver stage, which drives an output stage and the operating voltage of which is drawn from the positive and/or negative pole of voltage sources (V7/V7A), the opposite poles of which are connected to the output of the output stage; and the electronic amplifier comprises a power output stage, which operates in class A mode and the operating voltage of which is drawn from the positive and/or negative pole of at least one voltage source (V7/V7A), the opposite pole of which is connected to the output of a further power output stage, operating in class AB, B or C mode. Also, the first object is achieved by the electronic amplifier, wherein a cascode or inverting cascode circuit, which has a first transistor (QBot, Q2) in the emitter circuit of a second transistor (QTop, Q3), with common-base connection, and a third transistor (QP, Q4), which conducts a base current change of the second transistor (QTop, Q3) to the collector of the first transistor (QBot, Q2), in such a way that the sum of base and emitter current changes of the second transistor (QTop, Q3) is equal to the collector current change of the first transistor (QBot, Q2). The loop gain of the amplifier is increased by extended cascode circuits (designated by the inventor as "super-cascode circuits"), without increasing the number of amplifier stages within a control loop.

According to the electronic amplifier having a transistor (Q2), having in its emitter circuit a series circuit composed of two constant-current sources (I2, I3) and/or resistors and also a voltage source (V3), which is connected by one pole to the collector of the transistor (Q2) and by the other pole to the junction point between the constant-current sources (I2, I3) and/or resistors. The same object is achieved, finally, by virtue of the fact that the at least one amplifier stage contains a transistor having in its emitter circuit a series circuit composed of two constant-current sources and/or resistors and also a voltage source, which is connected by one pole to the collector of the transistor and by the other pole to the junction point between the constant-current sources and/or resistors.

A further object consists in specifying a circuit arrangement for converting the supply system voltage of the power supply system into a harmonic-free and DC voltage-free sinusoidal AC voltage for generating the operating voltages of amplifier stages.

This second object is achieved by an electronic amplifier for drawing a harmonic-free and DC voltage-free sinusoidal AC voltage at its output, for generating the operating voltages for amplifiers wherein a control voltage is fed to the positive input of the amplifier (AMP1), which control voltage consists of a harmonic-free and DC voltage-free sinusoidal voltage (V4) which, in terms of its amplitude, frequency and phase, corresponds to the sinusoidal voltage (V1) of the supply system voltage (V1+V2+V3) contaminated with harmonics (V2) and DC voltages (V3), the operating voltage of the amplifier (AMP1) being drawn from the positive and/or negative pole of voltage sources (V5/V6) the opposite poles of which are connected to said supply system voltage (V1+V2+V3).

Advantageous configurations of the invention are an electronic amplifier, wherein:

a voltage (UY) supplied by the second stage is fed back to the first stage;
the operating voltage of the first stage is drawn from the outputs of auxiliary amplifiers (OP3, OP4), the noninverting inputs of which are at positive and/or negative potentials (V1+/V1A−) which are always constant with respect to the input signal (UE);
the operating voltage of the first stage is drawn from the positive and/or negative pole of voltage sources (V1/V1A), the opposite poles of which are at the same potential as the input signal (UE), and/or in that the operating voltage of the second stage is drawn from the positive and/or negative pole of voltage sources (V5, V5A) the opposite poles of which are at the same potential as the voltage supplied by the first stage;
the opposite poles of the voltage sources (V1/V1A, V5/V5A) are connected to the output of an auxiliary amplifier (OP1, OP2) controlled by the input signal (UE);
the operating voltage of the first amplifier (OP1) is drawn from the positive and/or negative pole of voltage sources (V3, V4), the opposite poles of which are connected to the output of an auxiliary amplifier (OP3) controlled by the input voltage (UE);
the emitter-collector path of the third transistor (QP, Q4) is connected in parallel with the base-emitter junction of the second transistor (QTop, Q3), a fixed bias voltage (Uh, V4) being present at the base of said third transistor and the emitter of said third transistor being fed via a constant-current source (I, I6) or a high-resistance resistor;
a DC voltage (U1) is present at the base of the first transistor (QBot) and an extremely constant current can be drawn from the collector of the second transistor (QTop); and
the control voltage (V4) to be fed to the positive input of the amplifier (AMP1) is obtained by filtering out the sinusoidal voltage (V1) from the supply system voltage (V1+V2+V3) contaminated with harmonics (V2) and DC voltages (V3).

The advantages obtained by means of the invention consist, in particular, in the fact that, as a result of the exceptionally high differential gain, the linearity is increased to such a great extent, and as a result the signal distortion caused by the amplifier is reduced to such a great extent, that this is no longer detectable metrologically.

Some exemplary embodiments of the invention are described in greater detail below with reference to FIGS. 1 to 14, in which:

FIG. 2 shows the circuit arrangement of an amplifier according to the invention in two halves (FIGS. 2.1 and 2.2), FIG. 3 shows the circuit arrangement of a further amplifier according to the invention in two halves (FIGS. 3.1 and 3.2)

The solutions according to the invention exhibit amplifier circuits having a significantly increased voltage gain and linearity in comparison with the prior art. What is essential in this case is the use of a "super cascade circuit" that eliminates the Early effect, and also the principle of the "floating sources", which should be understood in this context to mean that, unlike conventional practice according to the prior art, the operating voltage sources are not connected to quiescent ground potential, but rather to a fluctuating potential, which can be, for example, the input or output potential of an amplifier stage.

Figure 21:
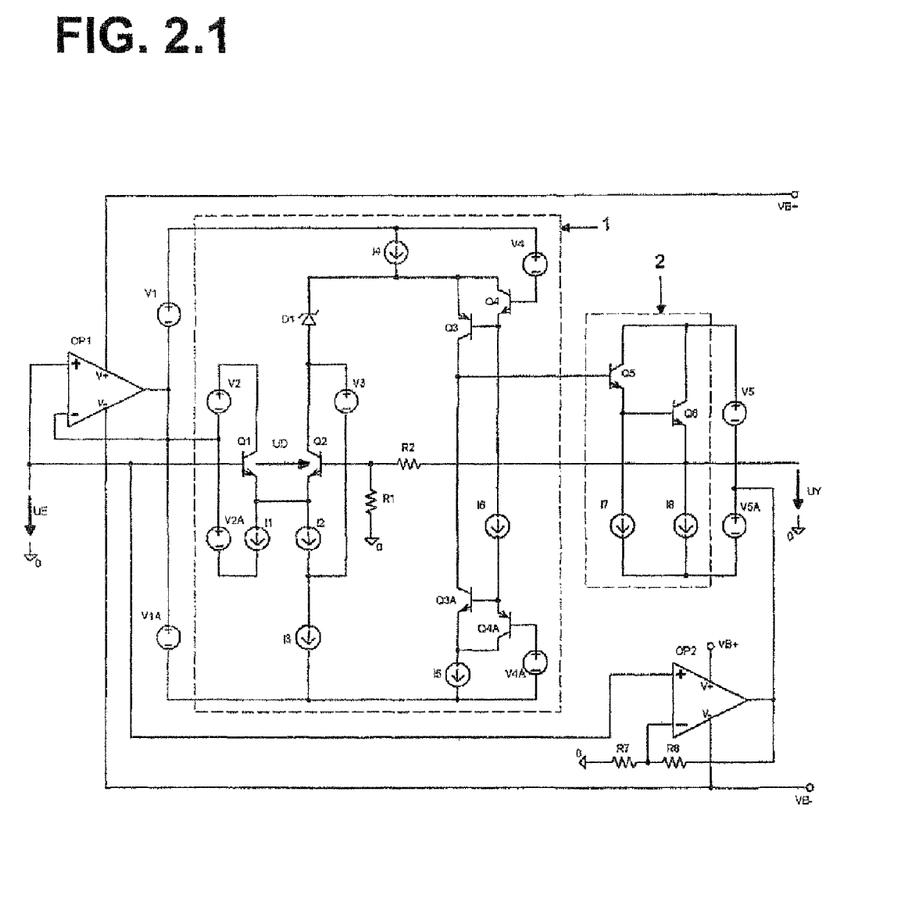
Figure 22:
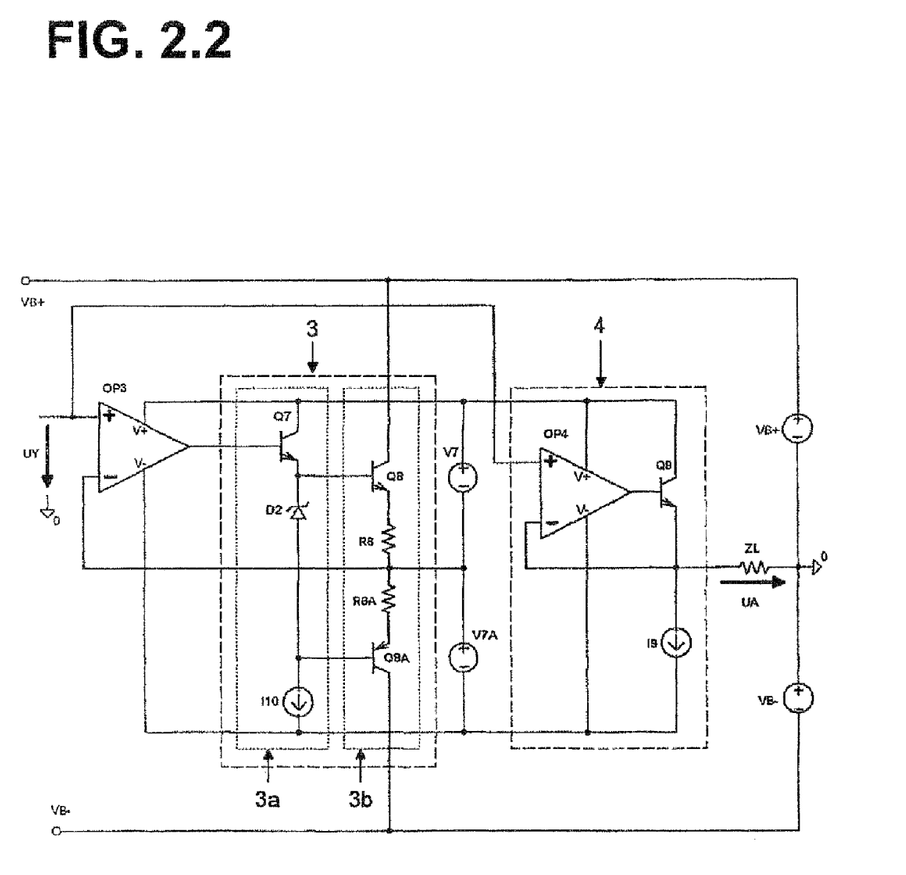

The circuit arrangement illustrated in a manner spread over FIGS. 2.1 and 2.2 is similar to the circuit arrangement in accordance with FIG. 1 in terms of the basic structure, but has been extended and modified according to the invention. FIGS. 2.1 and 2.2 show an amplifier circuit which has "floating sources", auxiliary amplifiers and also a "super-inverting cascode circuit" that eliminates the Early effect, and thus contains the inventive central concept. The circuit diagrams according to FIGS. 2.1 and 2.2 are connected to one another via the contacts VB+, VB− and UY and use the same reference ground.

The input voltage UE is fed to the input of an auxiliary amplifier, represented here by an operational amplifier OP1, for example, and to the base of the transistor Q1, the quiescent current of which is determined by the constant-current source I1, and said amplifier and said transistor are both fed from two voltages sources V2 and V2A, which are referred to the output potential of the operational amplifier OP1 and thus approximately to the input potential UE, that is to say "float" at this potential, and permits operation of the transistor Q1 with, in comparison with the operating voltages VB+, VB−, reduced collector-emitter voltage of approximately constant magnitude and increased collector current for a given power loss. Even in the case of full modulation, the voltage drop across and the current flow through the constant-current source I1 are approximately constant, even when the latter is formed by a current source having a finite internal resistance or only by an ohmic resistor.

The transistors Q1 and Q2 are connected as a differential amplifier, between the bases of which the voltage UD is present.

A series circuit composed of two constant-current sources I2 and I3 is situated in the emitter circuit of the transistor Q2. The quiescent current of the transistor Q2 is determined by the constant-current source I2 and flows via a voltage source V3 to the collector of said transistor, said voltage source being connected by one pole to the junction point between the two series-connected constant-current sources I2 and I3 and by the other pole to the collector of the transistor Q2.

A constant-current source I4 and a transistor Q3 extend the arrangement around the transistor Q2 to form an inverting cascode circuit. The transistor Q4 eliminates the influence of the base current change—caused by the Early effect—of the transistor Q3 in the case of modulation if the collector-emitter voltage thereof changes. Without the presence of the transistor Q4, a change in the base current in the transistor Q3 would reduce the voltage gain dUY/dUD. The emitter of the transistor Q4 is connected to the base of the transistor Q3 and the collector of the transistor Q4 is connected to the emitter of the transistor Q3.

Two transistors Q3A and Q4A and a constant-current source I5 together form a constant-current source (or constant-current sink) in a cascode circuit, wherein the transistor Q4A eliminates the influence of the base current change—caused by the Early effect—of the transistor Q3A in the case of modulation if the collector-emitter voltage thereof changes. Without the transistor Q4A, a change in the base current in the transistor Q3A would reduce the voltage gain of the arrangement. The emitter of the transistor Q4A is connected to the base of the transistor Q3A and the collector of the transistor Q4A is connected to the emitter of the transistor Q3A. The operating points of the transistors Q4 and Q4A are set by voltage sources V4 and V4A and by a constant-current source I6.

The entire voltage-amplifying state 1 is fed from voltage sources V1 and V1A, which are connected to the output of the operational amplifier OP1, such that they "float" at the potential of said output and hence also at the potential of the input signal UE. As a result of this measure, the constant-current source I3 is operated with a constant voltage drop. In contrast to the circuit according to the prior art, the current of the constant-current source I3 also remains constant in the case of modulation, even when said source has a finite internal resistance.

The amplifier stage 1 is adjoined by an impedance converter 2, which is formed by two transistors Q5, Q6 and two constant-current sources I7, I8 and is fed from voltage sources V5 and V5A, which are connected to the output of a further auxiliary amplifier, for example an operational amplifier OP2 which is likewise driven with the input signal UE and preferably amplifies the latter with the same gain factor as the amplifier stage 1 (R2/R1=R8/R7), such that the constant-current sources I7 and I8 are operated with an approximately constant voltage drop and the transistors Q5 and Q6 are operated with an approximately constant collector-emitter voltage. The Early effect and the Miller capacitance accordingly have no effect.

Since the voltage sources V5 and V5A have reduced voltages in comparison with the operating voltage sources VB+ and VB−, the transistors Q5 and Q6 can be comparatively small and operate with a low base capacitance and with a high driver power.

If the currents of the constant-current sources I4=I3+I5 are chosen, then no current flows between the emitters of the transistors Q1 and Q2 in the non-modulated state.

If the currents I2>>I3, are chosen, then the transistor Q2 can be operated with increased collector current and hence increased transfer transconductance $S=dIc/dUbe=Ic/U_T$ in comparison with the transistors Q3 and Q3A. For reasons of symmetry, I1=I2 is preferably chosen. With I1=I2>>I3, the differential amplifier has increased transfer transconductance, such that small voltage changes dUD lead to comparatively large collector current changes in the transistor Q2. Since the transistor Q3 is operated with a smaller collector current than the transistor Q2, a transistor having a small chip area and low parasitic capacitances can be used for it. Since comparatively large collector current changes in the transistor Q2 charge very small parasitic capacitances, a good dynamic range and an extremely high gain-bandwidth product can be obtained with this arrangement.

The zener diode D1 shifts the potential between the emitter of the transistor Q3 and the collector of the transistor Q2, which can therefore be operated with a significantly reduced collector-emitter voltage in comparison with the operating voltages VB+ and VB−. The zener voltage of the zener diode D1 is preferably chosen such that the collector-emitter voltages of the transistors Q1 and Q2 are identical to one another.

The entire voltage-amplifying stage 1 is fed from two voltage sources V1 and V1A, which "float" at the output signal of the operational amplifier OP1, such that the voltage drops across the constant-current sources I3, I4 and I5 therefore also remain constant in the case of modulation.

The operational amplifiers OP1 and OP2 can be fed from the voltage sources VB+ and VB− which are operating voltage sources which feed the entire arrangement and from which the energy required for feeding the load impedances ZL is drawn.

The voltage UY is present at the emitter of the transistor Q6, said voltage being identical in amplitude to the output voltage UA that is dropped across the load impedance ZL. The voltage UY serves only as a signal and is not loaded with the load impedance ZL, which, as explained below, is fed by a combination of two power output stages 3, 4.

The signal voltage UY is fed to the noninverting input of an operational amplifier OP3, which controls the base of a transistor Q7, which together with the current source I10 forms a linear, analog driver stage 3a that is fed from two voltage sources V7, V7A. A voltage drop across D2 sets operating points and generates the necessary bias voltage for the bases of the transistors Q8, Q8A. The power stage 3b operates in class AB, B or C mode, is formed from two transistors Q8, Q8A and is controlled by the driver stage 3a. The transistor Q7 and the current source I10 are fed from sources V7, V7A, which are connected to the output of the stage 3b, that is to say float at the output potential of said stage. Consequently the transistor Q7 is operated with an approximately constant collector-emitter voltage and the current source I10 is operated with an approximately constant voltage drop. The Early effect and the Miller capacitance accordingly have no effect. The transistors Q8, Q8A are fed from the operating voltage sources VB+ and VB−, which supply the entire arrangement and from which the energy required for feeding the load impedance ZL is drawn.

The circuit stages 3a and 3b together form the current-amplifying power amplifier stage 3. From the voltage sources V7, V7A floating at the output potential of the stage 3b, the amplifier stage 4 is fed, which amplifier stage 4 operates in class A mode and is embodied here in single-ended configuration, for example, and drives the load impedance ZL. Since said stage 4 operates in class A mode, the voltage UA present across the load impedance ZL is not contaminated with signal harmonics originating from transfer distortions. The voltages of the voltage sources V7 and V7A are smaller than those of the operating voltage sources VB+ and VB− such that the stage 4 can be operated with a small voltage, high quiescent current and moderate power loss.

The stage 3b operates in class AB, B or C mode with a small quiescent current and good efficiency. The stage 3 thus produces transfer distortions which, however, reach the load impedance ZL only to a significantly reduced extent since they are damped by the stage 4. The arrangement thus has the lack of distortion of a stage operating in class A mode and approximately the efficiency of a stage operating in class AB mode.

FIGS. 3.1 and 3.2 show a circuit arrangement according to the invention in a symmetrical configuration. The function is analogous to the circuit arrangement in accordance with FIGS. 2.1 and 2.2, except that all the stages are embodied in push-pull configuration. The circuit diagrams according to FIGS. 3.1 and 3.2 are connected to one another via the contacts VB+, VB−, V5+, V5A− and via UY and use the same reference ground.

Figure 32:
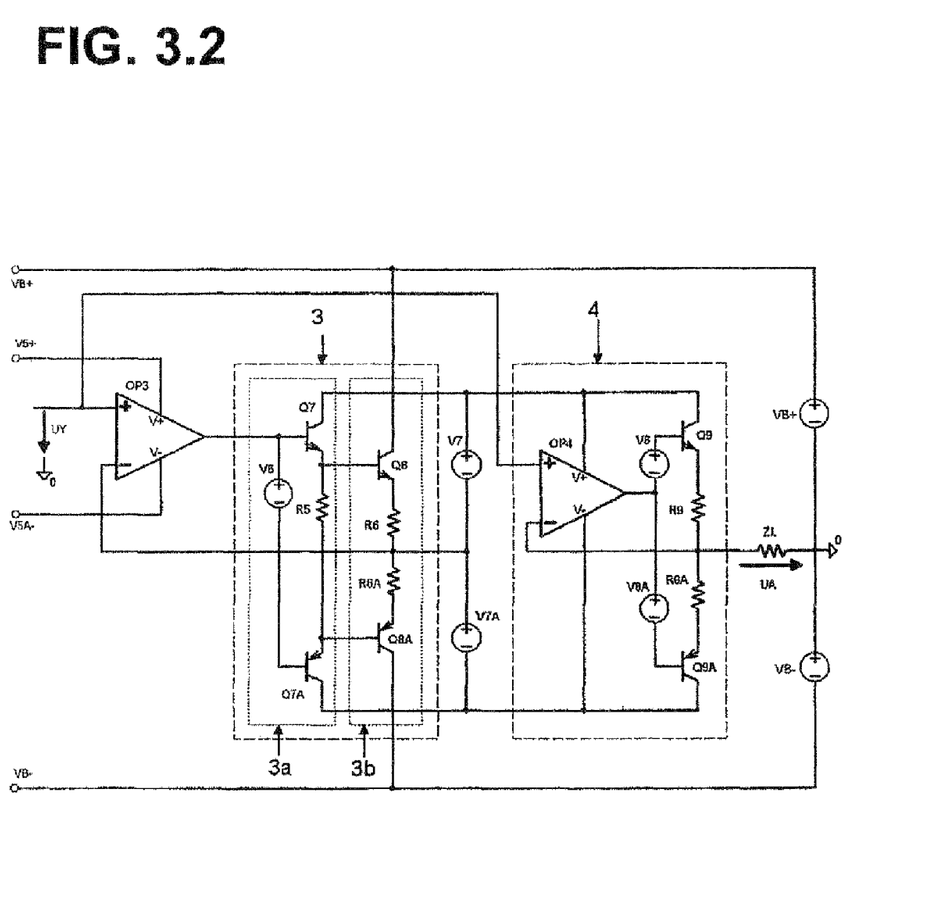

The stage 4 is also designed in a push-pull arrangement and preferably operates in class A mode.

Figure 31:
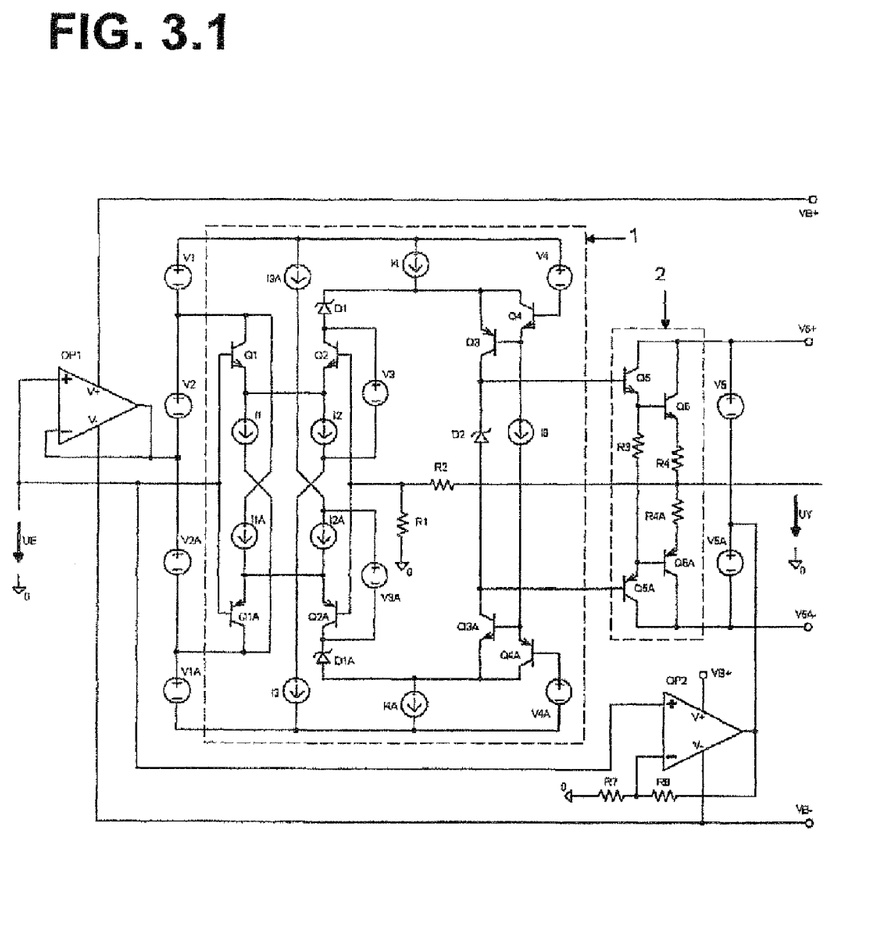

In contrast to FIG. 2.1, in FIG. 3.1, the components Q3A, Q4A, I4A in conjunction with Q2A form a further inverting cascode circuit. The following dimensioning is preferably chosen in FIG. 3.1:

$$I1 = I1A = I2 = I2A \gg I4 = I4A = 2 \times I3 = 2 \times I3A$$

Figure 4:
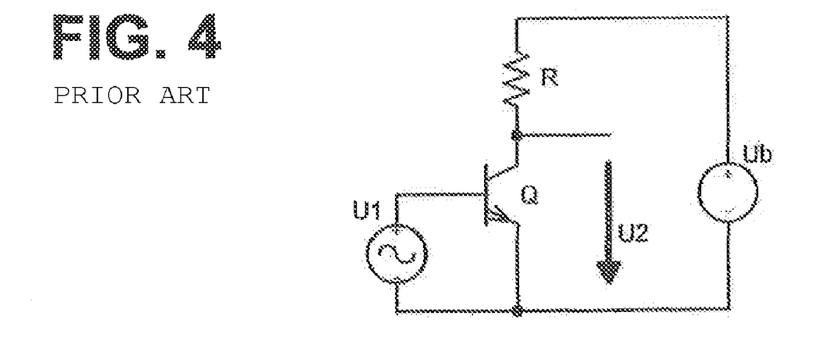
FIG. 4 shows the circuit arrangement of a known amplifier stage with common-emitter connection.

For the mathematical calculation of the "super-cascode circuit" according to the invention, the simple amplifier stage with common-emitter connection as shown in FIG. 4 will firstly be considered. The small-signal gain at the operating point is determined by differentially acting impedances and amounts to:

$$\frac{dU2}{dU1} = \frac{R \text{parallel} r_{CE}}{r_E} = \frac{1}{\left(\frac{1}{R} + \frac{1}{r_{CE}}\right) \cdot \frac{U_T}{I_E}} = \frac{I_E}{\left(\frac{1}{R} + \frac{1}{r_{CE}}\right) \cdot U_T}$$

Even if R is very large, the Early effect limits the voltage gain:

$$\lim_{R \to \infty} \frac{I_E}{\left(\frac{1}{R} + \frac{1}{r_{CE}}\right) \cdot U_T} = \frac{I_E \cdot r_{CE}}{U_T} = \frac{I_E \cdot \frac{U_A}{I_{C0}}}{U_T} \approx \frac{U_A}{U_T}$$

typ. value: $\frac{dU2}{dU1} = \frac{100\ V}{25\ mV} = 4000$

In the transistor equivalent circuit diagram according to Gummel-Poon a differential resistance $r_{CE}$ is situated in parallel with the transistor current sink between collector and emitter. A current flows through said differential resistance in the case of a collector-emitter voltage change, and reduces the voltage gain.

Figure 5:
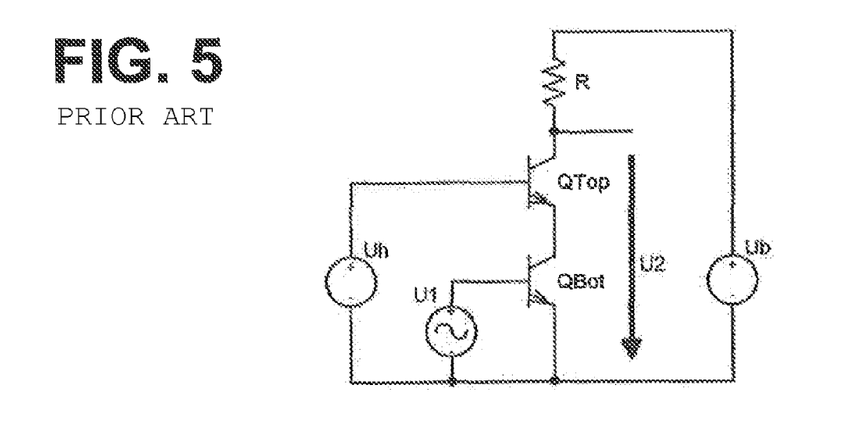
FIG. 5 shows the circuit arrangement of a known amplifier stage with common-emitter connection extended to form a cascode circuit.

The influence of the Early effect can be reduced if the common-emitter connection is extended to form a cascode circuit as shown in FIG. 5. In this case, the bottom transistor QBot is operated with an approximately constant collector-emitter voltage, such that the Early effect scarcely becomes apparent. Therefore, a significantly larger voltage gain can be obtained with the cascode circuit. However, the voltage gain is limited here as well, even in the case of an infinitely large resistance R, because, with a fluctuating collector-emitter voltage of the top transistor QTop caused by the Early effect, the base current of said transistor fluctuates even if the emitter current of said transistor remains constant.

Figure 6:
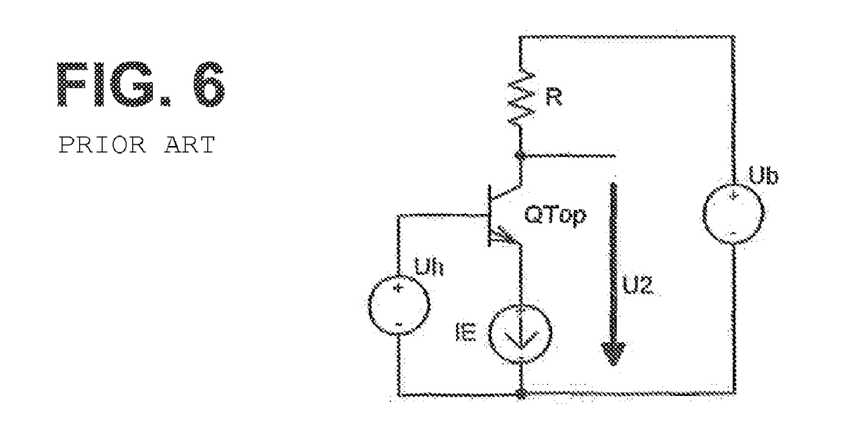
FIG. 6 shows the circuit arrangement of a known constant-current source in a cascode arrangement.

The maximum achievable voltage gain dU2/dU1 is determined by the output resistance of the cascode. In order to determine the maximum achievable output resistance of the arrangement, the following are defined: R=∞, U1=constant, U2=variable. The cascode stage becomes the constant-current source, and the circuit according to FIG. 6 arises. In this case, the following holds true:

$$I_B = \frac{I_E}{B+1} = \frac{I_E}{B_0 \cdot \left(1 + \frac{U_{CE}}{U_A}\right) + 1} =$$

$$\frac{I_E}{B_0 + \frac{B_0}{U_A} \cdot U_{CE} + 1} \Rightarrow \frac{dI_B}{dU_{CE}} = -\frac{I_E}{U_A} \cdot \frac{B_0}{\left[B_0 \cdot \left(1 + \frac{U_{CE}}{U_A}\right) + 1\right]^2}$$

for $U_A \gg U_{CE}$ and $B_0 \gg 1$ it holds true that: $\frac{dI_B}{dU_{CE}} \approx$ $$-\frac{I_E}{U_A \cdot B_0} \left(\text{mathematics } f'\left(\frac{1}{x}\right) = -\frac{f'(x)}{[f(x)]^2}\right)$$

A base current change in the case of a collector-emitter voltage change in the top transistor QTop brings about a reduction of the output resistance and of the voltage gain of the amplifier stage. If the emitter current $I_E$ remains ideally constant and R=∞, the output resistance $r_A$ is determined only by the base current change:

$$|r_A| = \left|\frac{dU_{CE}}{dI_B}\right| \approx \frac{U_A}{I_E} \cdot B_0 = r_{CE} \cdot B_0$$

The gain of the amplifier stage connected in a cascode circuit according to FIG. 5 is then calculated as follows:

$$\frac{dU2}{dU1} = \frac{r_A}{r_E} = \frac{U_A \cdot B_0 \cdot I_C}{I_E \cdot U_T} \approx \frac{U_A}{U_T} \cdot B_0$$

typ. value: $\frac{dU2}{dU1} = \frac{100 \text{ V}}{25 \text{ mV}} \cdot 300 = 120000$ Instead of the bipolar transistor QTop, a field effect transistor could be used in the upper part of the cascode according to FIG. 5. In the case of quasi-static changes in the voltage U2, no gate current flows. In the case of a dynamic change in said voltage U2, however, a gate current will flow via the drain-gate capacitance, and the same problem as in the case of a bipolar transistor occurs.

If an even greater gain factor is required, the influence of the base current of the top transistor QTop has to be reduced. This can be done by using the inventive "super-cascode circuit" according to FIG. 7.

Figure 7:
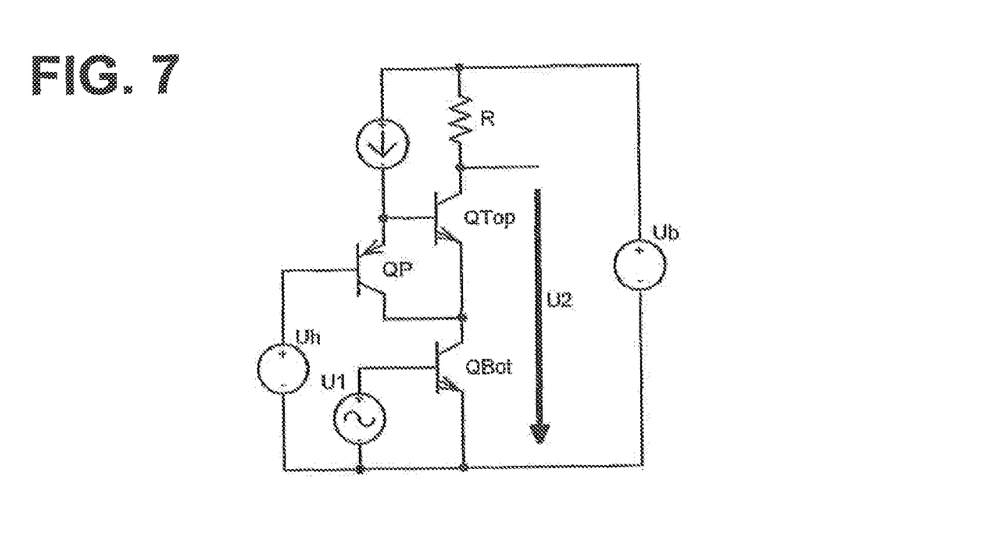
FIG. 7 shows the circuit arrangement of a cascode circuit extended according to the invention to form a "super-cascode circuit"

A PNP transistor QP in FIG. 7 conducts a base current change of the top transistor QTop to the collector of the bottom transistor QBot, which operates as a controlled current sink. If the voltage U2 rises, then the collector-emitter voltage of the top transistor QTop also rises. Owing to the Early effect, the current gain B of said transistor also rises, and it base current falls. Since the collector-emitter voltage of the bottom transistor QBot also remains approximately constant in the case of changes in the magnitude of the voltage U2, the collector current of the bottom transistor QBot also remains constant to a good approximation. Since the transistor QP conducts the magnitude of the reduction of the base current of the top transistor QTop to the collector of the bottom transistor QBot, the emitter current of the top transistor QTop has to decrease by the same magnitude. Consequently, the collector current in the top transistor QTop also remains approximately constant in the case of fluctuations of the voltage U2. Theoretically, by means of this measure, the output resistance $r_A$ can be increased again by the factor $B_0$. The current source I sets the quiescent current for the transistor QP.

With this circuit trick, it is possible to realize an amplifier stage or a constant-current source having a very large output resistance. The combination of amplifier stage and constant-current source in the configuration mentioned forms a single-stage amplifier arrangement having a very large voltage gain.

In FIG. 2.1, such an amplifier stage is represented by the transistors Q2, Q3, Q4 with the constant-current source Q3A, Q4A, I5.

Figure 8:
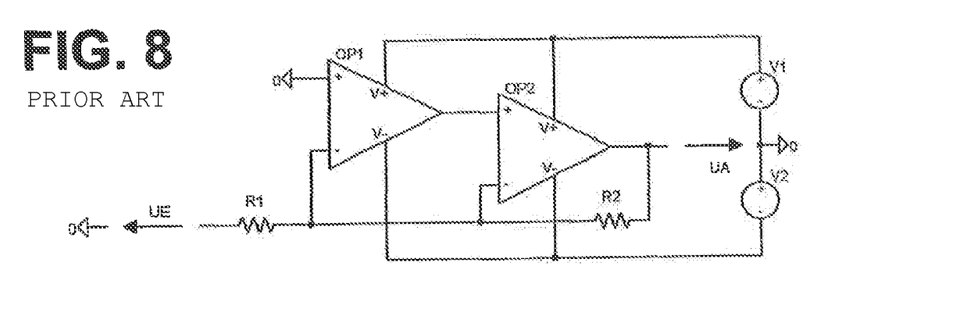
FIG. 8 shows the circuit arrangement of an inverting broadband compound amplifier formed from two operational amplifiers and known by the designation "Goldberg circuit"

FIG. 8 shows an amplifier circuit which is known by the designation Goldberg circuit from the literature (Manfred Seifart, Analoge Schaltungen [Analog circuits], Verlag Technik, Berlin), has two amplifiers in a compound embodiment and is illustrated as an inverting compound amplifier.

This circuit arrangement has a gain factor UA/UE≈−R2/R1 and also a differential gain corresponding to the product of the differential gains of the two operational amplifiers OP1, OP2. What is disadvantageous is that only the inverting input is available.

Figure 9:
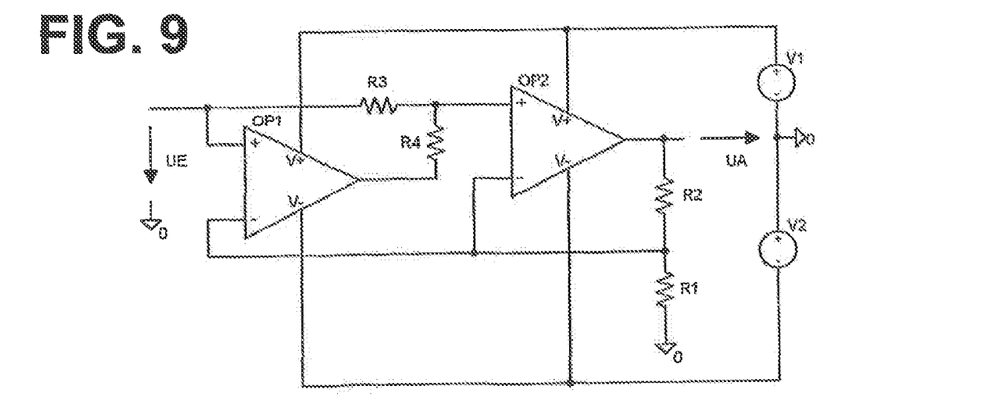
FIG. 9 shows the circuit arrangement of a noninverting broadband compound amplifier formed from two operational amplifiers.

The circuit arrangement according to FIG. 9 shows two amplifiers in a compound embodiment with a noninverting gain. The gain factor here is UA/UE≈1+R2/R1.

Figure 10:
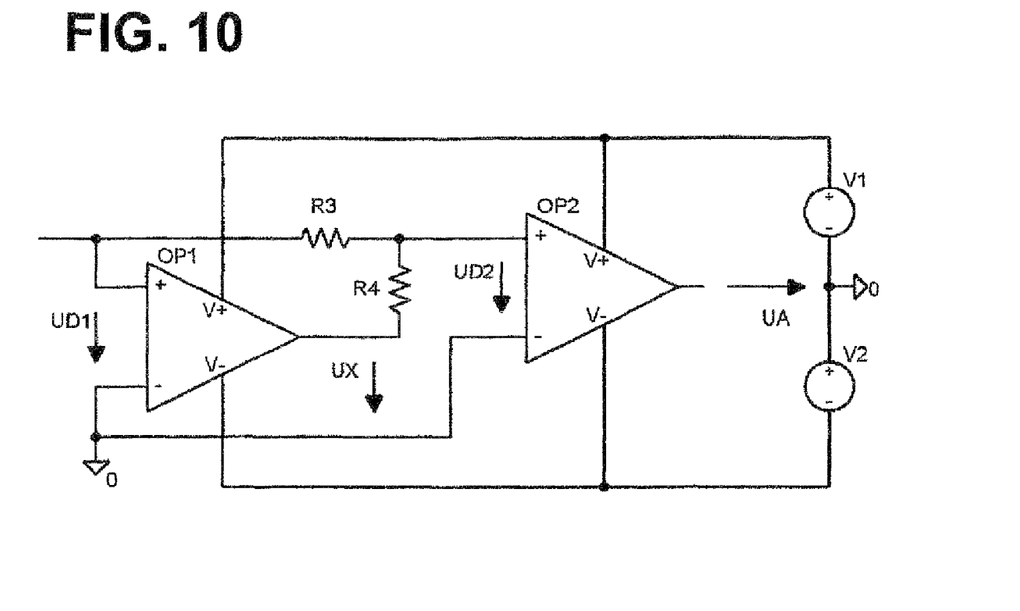
FIG. 10 shows the circuit arrangement of the compound amplifier according to FIG. 9, but with an interrupted feedback loop.

The circuit arrangement according to FIG. 10 shows the noninverting compound amplifier according to FIG. 9 with an interrupted feedback loop and serves for calculating the differential gain, where A1 is the differential gain of the amplifier OP1 and A2 is the differential gain of the amplifier OP2. The differential gain UA/UD1 is then calculated as follows:

$$UX = UD1 \cdot A1$$

$$UA = UD2 \cdot A2 \Rightarrow UD2 = \frac{UA}{A2}$$

$$UD2 = \frac{UX - UD1}{R3 + R4} \cdot R3 + UD1$$

$$\frac{UA}{A2} = \frac{UD1 \cdot A1 - UD1}{R3 + R4} \cdot R3 + UD1$$

$$\frac{UA}{A2} = \frac{UD1 \cdot (A1 - 1)}{R3 + R4} \cdot R3 + UD1$$

$$\frac{UA}{A2} = UD1 \cdot \left[(A1 - 1) \cdot \frac{R3}{R3 + R4} + 1\right]$$

$$\frac{UA}{UD1} = A2 \cdot \left[(A1 - 1) \cdot \frac{R3}{R3 + R4} + 1\right]$$

The differential gain of the noninverting compound amplifier according to FIG. 9, given suitable dimensioning, is likewise of an order of magnitude that results from the product of the gain factors of the individual amplifiers. In this case, a compact amplifier should be understood to mean a circuit arrangement composed of at least two amplifiers, the differential gain voltage gain of which is of the order of magnitude of the product of the voltage gains of the individual amplifiers.

Circuit arrangements with compound amplifiers are of interest primarily when amplifiers having different properties are combined. If, in FIG. 9, by way of example, a low-drift amplifier is used for the amplifier OP1 and a broadband amplifier is used for the amplifier OP2, then the arrangement behaves like a low-drift broadband amplifier.

The noninverting compound amplifier has the disadvantage, however, that the amplifier OP2 amplifies voltages which originate from common-mode interference of the amplifier OP1. This circumstance becomes apparent primarily in the case of steep-edged input voltage jumps UE since the common-mode rejection in the case of amplifiers decreases as the useful signal frequency rises. The problem does not occur in the case of the inverting compound amplifier according to FIG. 8 since the amplifiers there do not see common-mode signals.

In practice, therefore, in FIG. 9, the amplifier OP1 has to have a limited bandwidth in order that transient interference does not occur at the noninverting input of the amplifier OP2. The advantage of the high differential gain is accordingly restricted to low frequencies.

Figure 11:
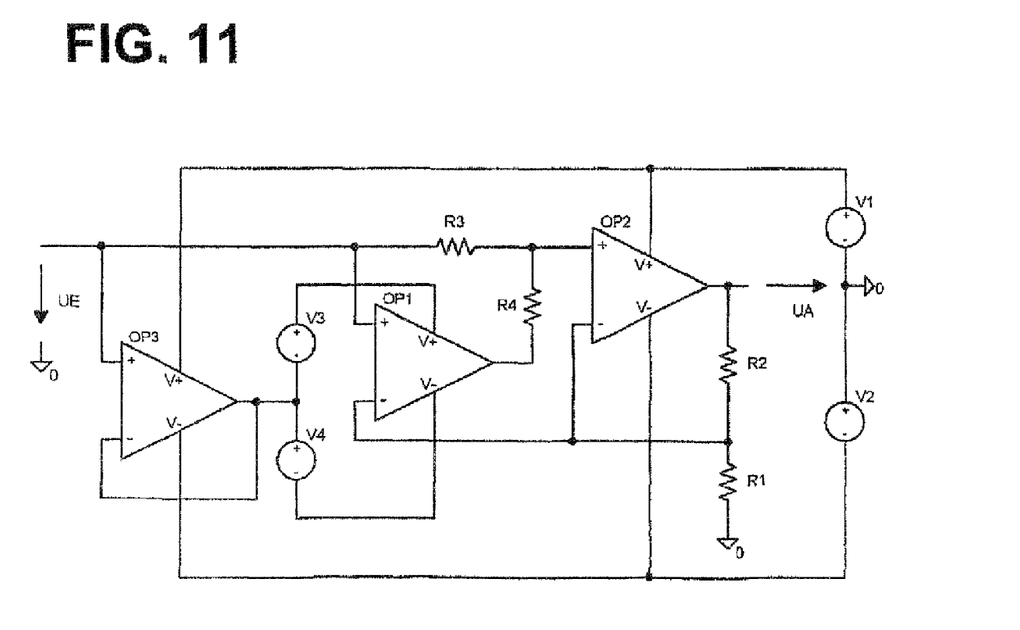
FIG. 11 shows the circuit arrangement of a broadband compound amplifier according to the invention with "floating sources"

This disadvantage can be eliminated if the principle of the "floating sources" is employed, as illustrated in the circuit arrangement according to the invention as shown in FIG. 11, where the amplifier OP1 is not supplied from the voltages sources V1 and V2 that are quiescent at reference ground but rather from voltage sources V3 and V4 situated at the output of an amplifier OP3 connected as a voltage follower. Consequently, the supply voltages of the amplifier OP1 "float" at the potential of the input signal UE. Accordingly, the potential at the noninverting input of the amplifier OP1 does not change relative to the supply potentials thereof. Consequently, this amplifier OP1 also does not see a common-mode signal in the case of modulation.

Figure 12:
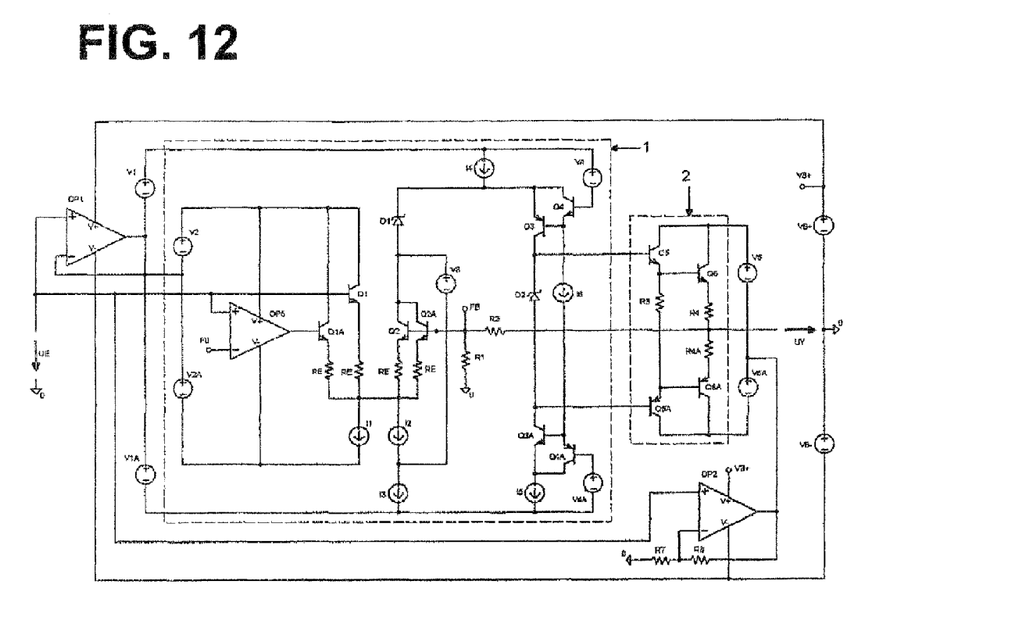
FIG. 12 shows the circuit arrangement of a further broadband compound amplifier according to the invention with "floating sources"

By employing this principle of the "floating sources" in conjunction the noninverting compound amplifier circuit arrangement (according to FIG. 11), the properties of the circuit arrangement according to the invention as shown in FIG. 2.1 can be significantly improved again, as illustrated in FIG. 12.

FIG. 12 shows a noninverting voltage amplifier analogously to FIG. 2.1. In a departure, here the differential amplifier is formed from four transistors. The transistor Q1 is driven directly with the input signal UE and the transistor Q1A is driven by a further amplifier OP5. The circuit section shown in discrete fashion in FIG. 12 corresponds to the amplifier OP2 in FIG. 11, the amplifier OP5 in FIG. 12 corresponds to the amplifier OP1 in FIG. 11 and the amplifier OP1 in FIG. 12 corresponds to the amplifier OP3 in FIG. 11. The inverting input of the amplifier OP5 in FIG. 12 is connected to the bases of the transistors Q2, Q2A via the connecting element FB. The junction point between the amplifiers is formed here by the node RE(Q1) and RE(Q1A). The particular advantage of this circuit arrangement stems from the fact that the amplifier OP5 corrects the noise voltages of the transistors Q1, Q1A, Q2, Q2A. The last-mentioned transistors can therefore be operated with unusually high quiescent current, and at the same time the arrangement has low noise.

By using the inventive "super-cascade circuit" it is easily possible to achieve gain factors of the order of magnitude of $10^7$ in a stage. If the amplifier OP5 is also equipped with such a stage, the differential gain of the circuit arrangement according to FIG. 12 is in the range around $10^{14}$. Broadband signal amplifier stages are generally operated with quiescent currents in the range of 1 mA to 10 mA. If the transistors Q1, Q1A, Q2, Q2A are operated with quiescent currents in the range of 100 mA to 1 A (I1=I2=10×I3 to 100×I3), gain factors of $10^{15}$ to $10^{16}$ can be achieved. As a result of the extremely high differential gain, distortion values of the amplifier structure can be brought far below the detection limit.

The principle of the "floating sources" can also be used as an active supply system filter, as explained below. Amplifiers and other sensitive electronic devices are usually fed from the lighting supply system via a transformer. Owing to the presence of switch-mode power supply units and rectifiers that often draw current having a non-sinusoidal profile from the lighting supply system, the voltage profile of the lighting supply system offered domestically has deviations from the sinusoidal shape by virtue of the fact that it exhibits harmonics and DC voltage components. The DC voltage components lead to a premagnetization of the transformer core, and the harmonics pass via the coupling capacitance between primary and secondary windings to the sensitive electronics.

DC voltage and harmonic components can be eliminated by an active supply system filter composed of auxiliary amplifier and "floating auxiliary sources" and the transformer can be fed in a manner free of DC voltage and harmonics.

Figure 13:
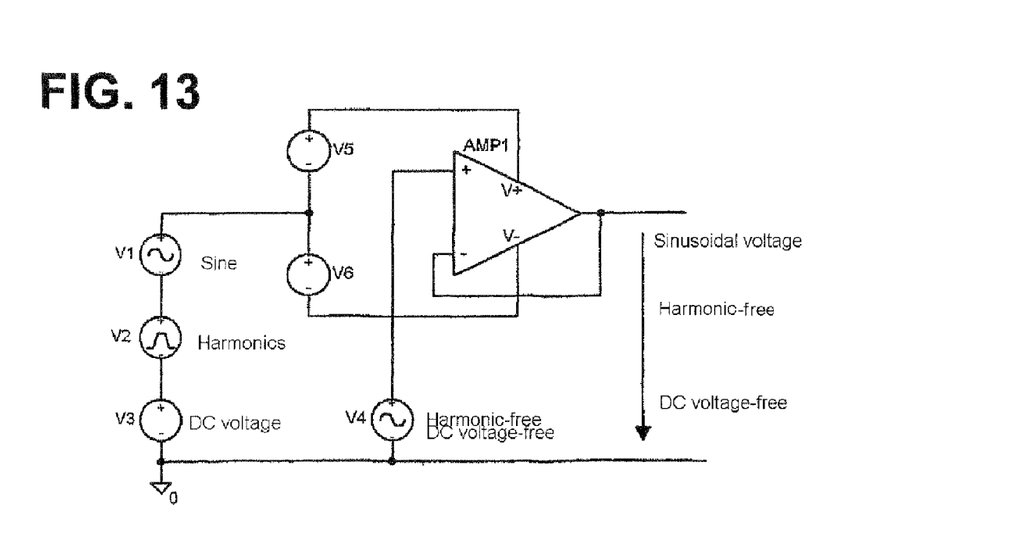
FIG. 13 shows the circuit arrangement of an active supply system filter according to the invention for generating a harmonic-free and DC voltage-free sinusoidal feed voltage for the amplifier circuits.

FIG. 13 shows an active supply system filter according to the invention. The voltage sources V1 to V3 simulate the supply system voltage exhibiting DC voltage and harmonics. In this case, it shall be supposed that V1 is a sinusoidal voltage source with 230 V~/50 Hz, V2 carries the harmonics, and V3 the DC voltage component. V5 and V6 are auxiliary voltage sources that "float" at the potential of a lighting supply system phase (V1+V2+V3). The ground symbol is at the potential of the neutral conductor. AMP1 is a power amplifier having a voltage gain factor of 1. V4 is a signal voltage source that carries a voltage signal similar to the lighting supply system in respect of phase and amplitude. In contrast to the lighting supply system, however, V4 is free of DC voltage and harmonics. Thus, the output of the power amplifier AMP1 carries a DC voltage-free and harmonic-free voltage that can be used to control the primary side of a transformer.

If voltage levels that are significantly smaller than the supply system voltage are chosen for V5 and V6 and, furthermore, class AB, B or C mode of operation is chosen for the power amplifier, then the active supply system filter operates with good efficiency.

Figure 14:
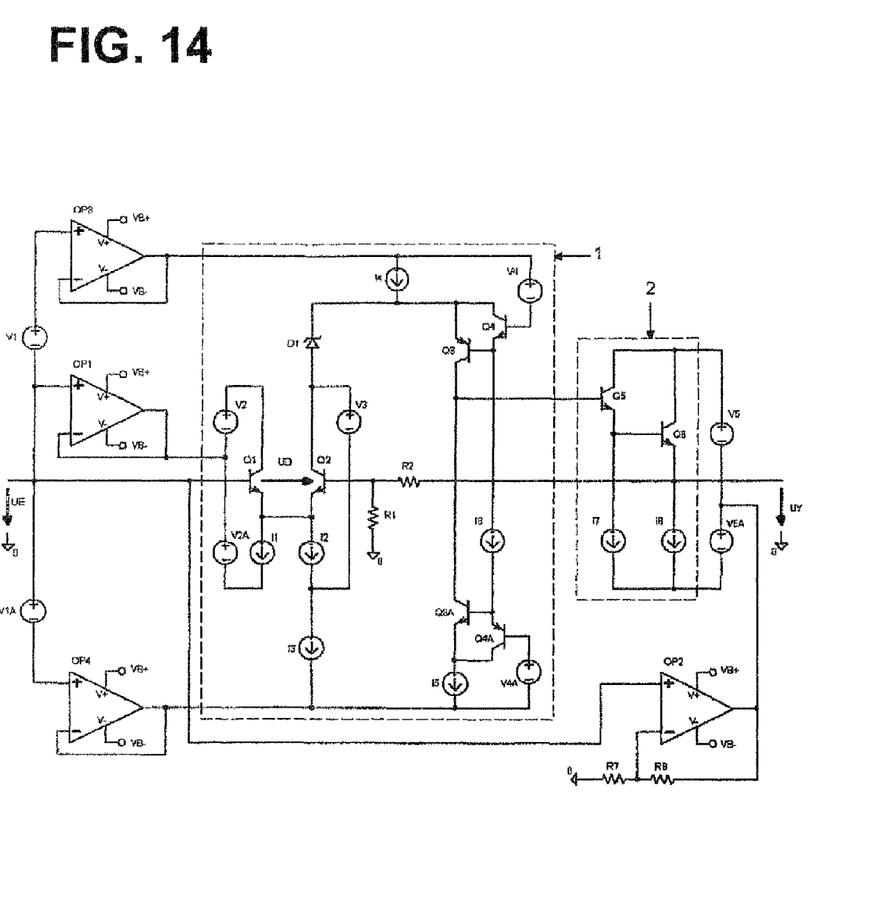
FIG. 14 shows the circuit arrangement of an amplifier according to FIG. 2.1 in which the operating voltage of the voltage-amplifying stage is drawn from the outputs of two auxiliary amplifiers which are controlled by "floating sources".

FIG. 14 shows an alternative to FIG. 2.1. The operating voltage of the voltage-amplifying stage 1 is in this case drawn from the outputs of two auxiliary amplifiers OP3, OP4, which are controlled at their noninverting inputs by "floating sources" V1, V1A that "float" at the input signal UE. As a result, in this case, too, the voltage-amplifying stage 1, according to the invention, is fed from potentials which are always constant with respect to the input signal UE.

| | Variables and formula symbols used |
|---|---|
| $A_D$ | Differential gain of an amplifier |
| B | Current gain factor of a bipolar transistor |
| $B_0$ | B with small collector-emitter voltages, that is to say without the influence of the Early effect |
| dU | Small-signal voltage change at the operating point |
| dI | Small-signal current change at the operating point |
| $I_c$ | Collector current in a bipolar transistor |
| $I_{c0}$ | $I_c$ with small collector-emitter voltages, that is to say without the influence of the Early effect |
| $I_B$ | Base current in a bipolar transistor |
| $I_E$ | Emitter current in a bipolar transistor |
| $r_{CE}$ | Small-signal resistance of the collector-emitter path of a bipolar transistor at the operating point |
| $r_E$ | Small-signal resistance of the emitter path of a bipolar transistor at the operating point |
| $r_A$ | Small-signal output resistance of a stage at the operating point |
| S | Transfer transconductance of a transistor |
| $U_A$ | Early voltage in a transistor |
| $U_{CE}$ | Collector-emitter voltage at a bipolar transistor |
| $U_D$ | Voltage difference between the inputs of a differential amplifier |
| $U_r$ | Voltage equivalent of thermal energy |

The invention claimed is:

1. An electronic amplifier, comprising:
   a first stage, which is controlled by an input voltage UE and the operating voltage of which is at positive and/or negative potentials (V1+/V1A−) which are always constant with respect to the input voltage (UE);
   a second, impedance-converting stage, which is controlled by a voltage supplied by the first stage and the operating voltage of which is at positive and/or negative potentials (V5+/V5A−) which are always constant with respect to the voltage supplied by the first stage; and
   the operating voltage of the first stage is drawn from the positive and/or negative pole of voltage sources (V1/V1A), the opposite poles of which are at the same potential as the input signal (UE), and/or in that the operating voltage of the second stage is drawn from the positive and/or negative pole of voltage sources (V5, V5A) the opposite poles of which are at the same potential as the voltage supplied by the first stage.

2. The electronic amplifier of claim 1, wherein a voltage (UY) supplied by the second stage is fed back to the first stage.

3. The electronic amplifier of claim 1, wherein the operating voltage of the first stage is drawn from the outputs of auxiliary amplifiers (OP3, OP4), the noninverting inputs of which are at positive and/or negative potentials (V1+/V1A−) which are always constant with respect to the input signal (UE).

4. The electronic amplifier of claim 1, wherein the opposite poles of the voltage sources (V1/V1A, V5/V5A) are connected to the output of an auxiliary amplifier (OP1, OP2) controlled by the input signal (UE).

5. An electronic amplifier of claim 1, wherein the amplifier is controlled by an input voltage (UE), and a first amplifier (OP1) and a second amplifier (OP2), which supplies an output signal (UA), said amplifiers cooperating as a noninverting compound amplifier, the operating voltage of the first amplifier (OP1) being at positive and/or negative potentials (V3+, V4−) which are always constant with respect to the input voltage (UE).

6. The electronic amplifier of claim 5, wherein the operating voltage of the first amplifier (OP1) is drawn from the positive and/or negative pole of voltage sources (V3, V4), the opposite poles of which are connected to the output of an auxiliary amplifier (OP3) controlled by the input voltage (UE).

7. An electronic amplifier of claim 1, wherein the first stage comprises a cascode or inverting cascode circuit, which has a first transistor (QBot, Q2) in the emitter circuit of a second transistor (QTop, Q3), with common-base connection, and
   a third transistor (QP, Q4), which conducts a base current change of the second transistor (QTop, Q3) to the collector of the first transistor (QBot, Q2), in such a way that the sum of base and emitter current changes of the second transistor (QTop, Q3) is equal to the collector current change of the first transistor (QBot, Q2).

8. The electronic amplifier of claim 7, wherein the emitter-collector path of the third transistor (QP, Q4) is connected in parallel with the base-emitter junction of the second transistor (QTop, Q3), a fixed bias voltage (Uh, V4) being present at the base of said third transistor and the emitter of said third transistor being fed via a constant-current source (I, I6) or a high-resistance resistor.

9. The electronic amplifier of claim 8, wherein a DC voltage (U1) is present at the base of the first transistor (QBot) and an extremely constant current can be drawn from the collector of the second transistor (QTop).

10. An electronic amplifier of claim 1, wherein a transistor (Q2) having in its emitter circuit a series circuit composed of two constant-current sources (I2, I3) and/or resistors and also a voltage source (V3), which is connected by one pole to the collector of the transistor (Q2) and by the other pole to the junction point between the constant-current sources (I2, I3) and/or resistors.

11. The electronic amplifier of claim 1, which draws a harmonic-free and DC voltage-free sinusoidal AC voltage at its output, and generates the operating voltages for the amplifier, wherein a control voltage is fed to the positive input of the amplifier (AMP1), which control voltage consists of a harmonic-free and DC voltage-free sinusoidal voltage (V4) which, in terms of its amplitude, frequency and phase, corresponds to the sinusoidal voltage (V1) of the supply system voltage (V1+V2+V3) contaminated with harmonics (V2) and DC voltages (V3), the operating voltage of the amplifier (AMP1) being drawn from the positive and/or negative pole of voltage sources (V5/V6) the opposite poles of which are connected to said supply system voltage (V1+V2+V3).

12. The electronic amplifier as claimed in claim 11, wherein the control voltage (V4) to be fed to the positive input of the amplifier (AMP1) is obtained by filtering out the sinusoidal voltage (V1) from the supply system voltage (V1+V2+V3) contaminated with harmonics (V2) and DC voltages (V3).

* * * * *